(12) United States Patent
Lilak et al.

(10) Patent No.: US 12,328,864 B2
(45) Date of Patent: Jun. 10, 2025

(54) 3D 1T1C STACKED DRAM STRUCTURE AND METHOD TO FABRICATE

(71) Applicant: Intel Corporation, Santa Clara, CA (US)

(72) Inventors: Aaron Lilak, Beaverton, OR (US); Sean T. Ma, Portland, OR (US); Abhishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 18/386,487

(22) Filed: Nov. 2, 2023

(65) Prior Publication Data

US 2024/0064958 A1 Feb. 22, 2024

Related U.S. Application Data

(62) Division of application No. 16/247,321, filed on Jan. 14, 2019, now Pat. No. 11,849,572.

(51) Int. Cl.
*H10B 12/00* (2023.01)
*H01L 23/528* (2006.01)
(Continued)

(52) U.S. Cl.
CPC .......... *H10B 12/30* (2023.02); *H01L 23/528* (2013.01); *H10B 12/03* (2023.02); *H10B 12/05* (2023.02);
(Continued)

(58) Field of Classification Search
CPC ........ H10B 12/03; H10B 12/05; H10B 12/30; H10B 12/482; H01L 23/528; H10D 1/692;
(Continued)

(56) References Cited

U.S. PATENT DOCUMENTS 8,687,399 B2 * 4/2014 Sekar .................. H10D 30/711
365/174
9,466,615 B2 10/2016 Miyairi
(Continued)

FOREIGN PATENT DOCUMENTS

CN 114373801 A * 4/2022 ....... H01L 27/10805
CN 115274666 A * 11/2022 ....... H01L 27/10805
(Continued)

*Primary Examiner* — Matthew E Warren
(74) *Attorney, Agent, or Firm* — Schwabe, Williamson & Wyatt P.C.

(57) ABSTRACT

Embodiments disclosed herein include three-dimensional 3D arrays of memory cells and methods of forming such devices. In an embodiment a memory device comprises, a substrate surface, and a three-dimensional (3D) array of memory cells over the substrate surface. In an embodiment each memory cell comprises a transistor and a capacitor. In an embodiment the transistor of each memory cell comprises, a semiconductor channel, with a first end of the semiconductor channel electrically coupled to a bit line that runs substantially parallel to the substrate surface, and a second end of the semiconductor channel is electrically coupled to the capacitor. The transistor may also comprise a gate dielectric on a surface of the semiconductor channel between the first end and the second end of the semiconductor channel. In an embodiment, the gate dielectric is contacted by a word line that runs substantially perpendicular to the substrate surface.

18 Claims, 16 Drawing Sheets

(51) Int. Cl.
 *H10D 1/68* (2025.01)
 *H10D 30/67* (2025.01)
(52) U.S. Cl.
 CPC ........... *H10B 12/482* (2023.02); *H10D 1/692* (2025.01); *H10D 30/6728* (2025.01); *H10D 30/6729* (2025.01); *H10D 30/6757* (2025.01)
(58) Field of Classification Search
 CPC ........... H10D 30/6728; H10D 30/6729; H10D 30/6757
 See application file for complete search history.

(56) References Cited

U.S. PATENT DOCUMENTS

| | | | |
|---|---|---|---|
| 9,735,280 | B2 | 8/2017 | Noda |
| 9,978,774 | B2 | 5/2018 | Yamazaki |
| 10,020,322 | B2 | 7/2018 | Ito |
| 10,468,414 | B2 * | 11/2019 | Kim ................ H01L 23/528 |
| 10,700,212 | B2 | 6/2020 | Sawai |
| 11,088,286 | B2 | 8/2021 | Hodo |
| 11,195,836 | B2 | 12/2021 | Kim |
| 2013/0153851 | A1 * | 6/2013 | Park ................ G11C 13/0016 |
| | | | 257/E47.001 |
| 2019/0006376 | A1 | 1/2019 | Ramaswamy |
| 2019/0164985 | A1 * | 5/2019 | Lee ................ H10B 12/05 |
| 2020/0411523 | A1 * | 12/2020 | Shin ................ H10B 12/02 |

FOREIGN PATENT DOCUMENTS

| | | | | |
|---|---|---|---|---|
| KR | 20190038223 | | 4/2019 | |
| KR | 20190038223 A | * | 4/2019 | ........ H01L 27/11526 |

* cited by examiner ated onto the structure, in accordance with an embodi-
3D 1T1C STACKED DRAM STRUCTURE AND METHOD TO FABRICATE

CROSS-REFERENCE TO RELATED APPLICATIONS

This application is a division of U.S. patent application Ser. No. 16/247,321, filed on Jan. 14, 2019, the entire contents of which is hereby incorporated by reference herein.

TECHNICAL FIELD

Embodiments of the disclosure are in the field of semiconductor structures and processing and, in particular, to 3D stacked dynamic random access memory (DRAM) structures and methods of fabricating such devices.

BACKGROUND

Typically, DRAM architectures (for either DRAM or eDRAM) is formed with a single-layer configuration. Further scaling of such devices is difficult since the capacitor needs to be large and requires either a trench-like capacitor to be formed or a capacitor over bitline (COB) capacitor to be formed in the upper metal layers. These road blocks limit the ability to increase the memory density of devices.

DESCRIPTION OF THE EMBODIMENTS

Figure 1A:
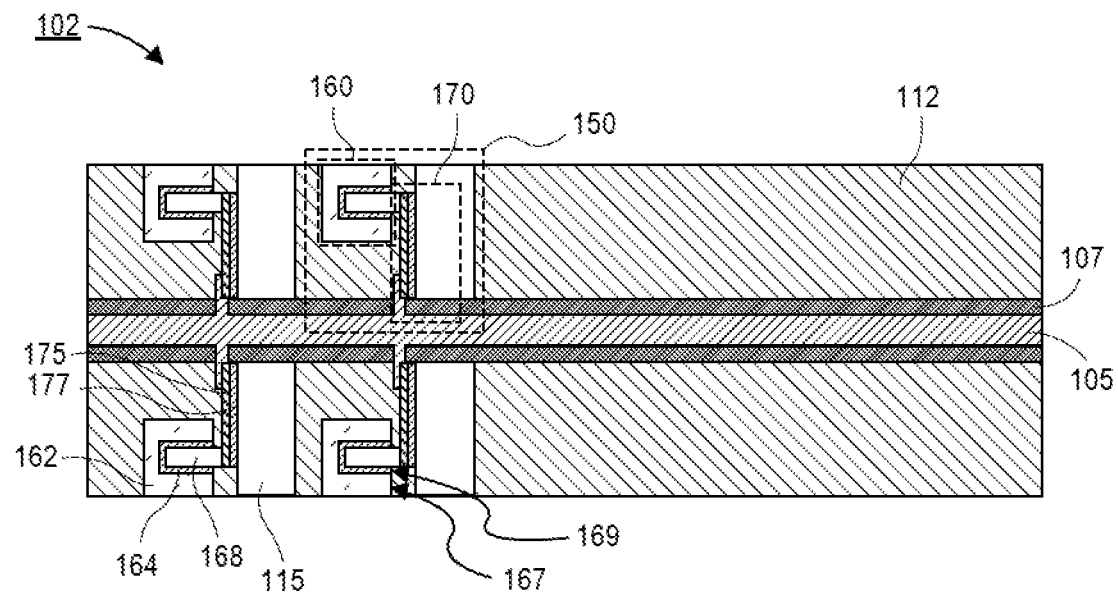
FIG. 1A is a plan view illustration of a single layer of a three-dimensional (3D) memory array, in accordance with an embodiment.

Embodiments described herein comprise 3D stacked DRAM structures and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, scaling of DRAM to provide increased memory density is currently limited by large capacitor configurations. Accordingly, embodiments disclosed herein include memory devices with 3D stacked DRAM cells. In an embodiment, each layer of the memory device may comprise a bit line, and a plurality of memory cells. In an embodiment, the memory cells may comprise a transistor and a capacitor. The transistor and capacitor of each memory cell may be oriented so that they are in a plane that is substantially parallel to an underlying substrate surface. Since the transistor and capacitor of each memory cell is in a single plane, the memory cells may be stacked in the vertical direction to provide increased memory density. Embodiments also allow for fabrication of each layer of the memory device substantially in parallel. Accordingly, embodiments allow for the complexity and cost of fabricating 3D stacked DRAM cells to be reduced.

Referring now to FIG. 1A, a plan view illustration of a single layer 102 of a memory device is shown. While a single layer 102 is shown for simplicity, it is to be appreciated that the memory device may comprise one or more layers 102 that are stacked in the vertical direction (i.e., out of plane of FIG. 1A). For example, the memory device may comprise two or more layers 102, four or more layers 102, eight or more layers 102, or sixteen or more layers 102. Particularly, the number of layers 102 of the memory device may only be limited by the capabilities of available lithography, etch and deposition tools.

In an embodiment, each layer 102 may comprise a plurality of memory cells 150 that are laterally surrounded by an insulating layer 112. In an embodiment, the insulating layer 112 may include any suitable electrical insulators, such as any suitable oxide or nitride. In some embodiments, the insulating layer 112 may be an interlayer dielectric (ILD) material, which may be doped or undoped. In FIG. 1A an array of four memory cells 150 is shown in the layer 102. In other embodiments, each layer 102 may comprise one or more memory cells 150, two or more memory cells 150, four or more memory cells 150, six or more memory cells, or eight or more memory cells 150. In an embodiment, each memory cells 150 may comprise a transistor 170 and a capacitor 160.

In an embodiment, the transistor 170 may comprise a semiconductor channel 175. The semiconductor channel 175 may be a thin film semiconductor material. In some embodiments, the semiconductor channel 175 may be deposited with a low temperature deposition process that is suitable for use in the back end of line (BEOL) metal layers of a die. For example, the semiconductor channel 175 may be formed of an amorphous, polycrystalline, or crystalline semiconductor, or an amorphous, polycrystalline, or crystalline semiconducting oxide. In some embodiments, the semiconductor channel 175 may be formed of an amorphous, polycrystalline, or crystalline group III-V material; amorphous, polycrystalline, or crystalline silicon; amorphous, polycrystalline, or crystalline germanium; amorphous, polycrystalline, or crystalline silicon germanium; amorphous, polycrystalline, or crystalline gallium arsenide; amorphous, polycrystalline, or crystalline indium antimonide; amorphous, polycrystalline, or crystalline indium gallium arsenide; amorphous, polycrystalline, or crystalline gallium antimonide; amorphous, polycrystalline, or crystalline tin oxide; amorphous, polycrystalline, or crystalline indium gallium oxide (IGO); or amorphous, polycrystalline, or crystalline indium gallium zinc oxide (IGZO).

In an embodiment, a first end of the semiconductor channel 175 may be contacted by a bit line 105, and a second end of the semiconductor channel 175 opposite from the first end may be contacted by the capacitor 160. In an embodiment, the semiconductor channel 175 may extend in a direction (i.e., between the first end and the second end) that is substantially perpendicular to the direction the bit line 105 extends. Furthermore, the semiconductor channel 175 and the bit line 105 may be oriented in substantially the same plane, as shown in FIG. 1A. In an embodiment, the bit line 105 contacts the semiconductor channel 175 of a plurality of transistors 150. For example, in FIG. 1A the bit line 105 contacts the semiconductor channel 175 of four transistors 150.

In an embodiment, the bit line 105 may have a spacer 107 formed along sidewall surfaces. In an embodiment, the spacer 107 may provide electrical isolation for the bit line 105. For example, the spacer 107 may electrically isolate the bit line 105 from the word line 115. Particularly, as shown in FIG. 1A, the word line 115 may be separated from the bit line 105 by the spacer 107 which directly contacts portions of the word line 115 and the bit line 105. In an embodiment, the spacer may be any suitable insulating material, such as such as a carbon-doped oxide, silicon nitride, silicon oxide, or other carbides or nitrides (e.g., silicon carbide, silicon nitride doped with carbon, and silicon oxynitride). The word lines 115 and the bit lines 105 may be formed of any suitable conductive material, such as a metal (e.g., copper, cobalt, tungsten, titanium, aluminum, ruthenium, etc.).

In an embodiment, the transistor 170 may further comprise a gate dielectric 177 that is positioned over a surface of the semiconductor channel 175. In an embodiment, the gate dielectric layer 177 may separate the semiconductor channel 175 from a word line 115 that serves as the gate electrode for the memory cell 150. The gate dielectric 177 may comprise a high-k dielectric material such as, for example, silicon oxide, aluminum oxide, or a high-k dielectric, such as hafnium oxide. More generally, the gate dielectric 177 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 177 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, the gate dielectric 177 may be a multi-layer gate dielectric including multiple different materials.

In an embodiment, each of the memory cells 150 in a layer 102 are contacted by different word lines 115. The word lines 115 may extend in a direction that is substantially perpendicular to the plane of the bit line 105 (i.e., out of the plane of FIG. 1A). Accordingly, each word line 115 may serve as the gate electrode to memory cells 150 in different layers of the memory devices, as will be described in greater detail below.

In an embodiment, each capacitor 160 may comprise a capacitor electrode 168, a capacitor dielectric 164 and a ground electrode 162. In an embodiment, the capacitor electrode 168 may contact the second end of the semiconductor channel 175. That is, in the transistor 170, the bit line 105 may be considered the source electrode and the capacitor electrode 168 may be considered the drain electrode. In an embodiment, the capacitor dielectric 164 may surround lateral surfaces of the capacitor electrode 168. For example, as shown in FIG. 1A the capacitor dielectric 164 may form a U-shape around a portion of the capacitor electrode 168. Furthermore, the capacitor dielectric 164 may be formed over a top surface and bottom surface (out of plane of FIG. 1A) of the capacitor electrode 168. In an embodiment, the capacitor dielectric 164 may be any suitable high-k dielectric material, such as those described above with respect to the gate dielectric 177. For example, the capacitor dielectric 164 may be hafnium oxide.

In an embodiment, a ground electrode 162 may be separated from the capacitor electrode 168 by the capacitor dielectric 164. While referred to as a ground electrode 162, it is to be appreciated that ground electrode 162 may be held at any desired potential. In an embodiment, the ground electrode 162 may wrap around the capacitor dielectric 164 with a U-shape, as shown in FIG. 1A. In an embodiment, a surface 167 of the ground electrode 162 may be substantially coplanar with a surface 169 of the capacitor dielectric 164. In an embodiment, the ground electrode 162 may extend in a direction that is substantially orthogonal to the direction of the bit line 105. As such, each ground electrode 162 may serve as the ground electrode to a plurality of capacitors 160 stacked over each other. In an embodiment, the ground electrode 162 may extend in a direction that is substantially parallel to the direction that the word line 115 extends.

Figure 1B:
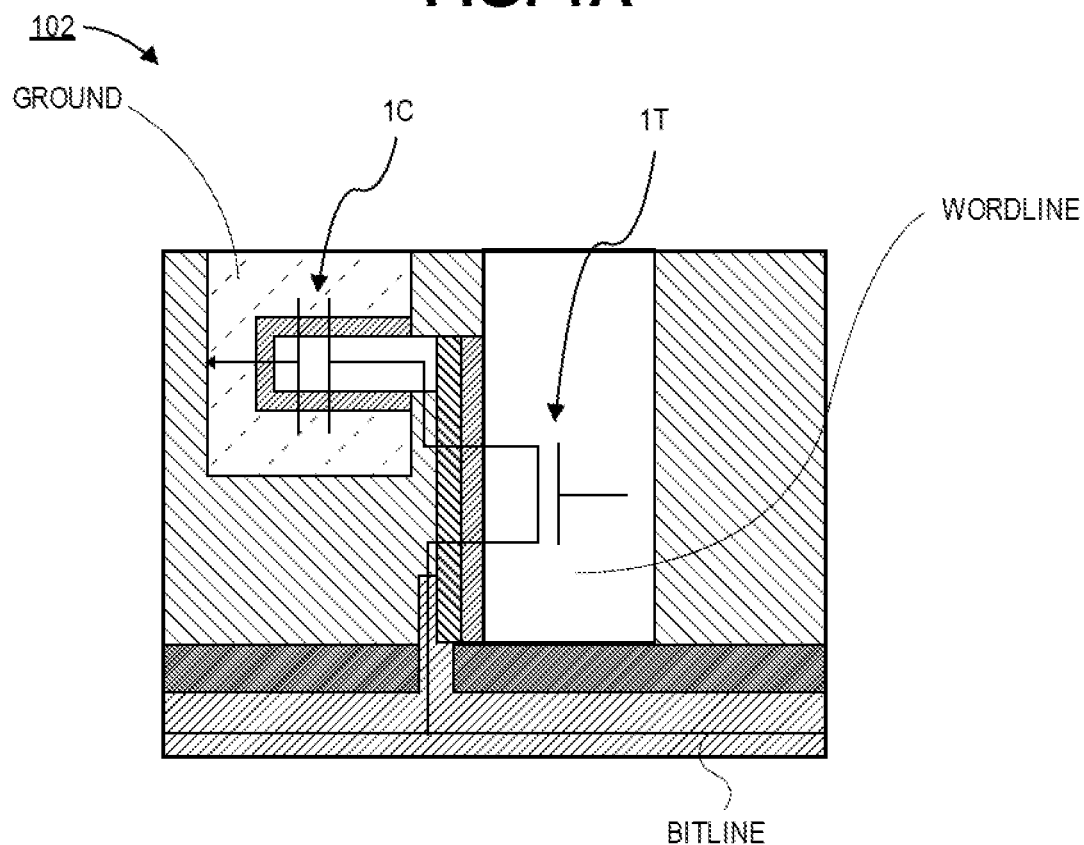
FIG. 1B is a plan view illustration of a single memory cell in a layer of a 3D memory array with a circuit diagram overlaid onto the structure, in accordance with an embodiment.

Referring now to FIG. 1B, a plan view illustration of a memory cell in a layer 102 with a circuit diagram overlaid over the structure is shown, in accordance with an embodiment. The memory cell in FIG. 1B is substantially similar to those illustrated in FIG. 1A, with the exception that the circuit diagram is provided to more clearly illustrate how the memory device functions. As shown, the bit line extends along and branches off towards the transistor 1T. The first terminal of the transistor 1T is coupled to the bit line and the second terminal of the transistor 1T is coupled to the capacitor 1C. In an embodiment, the word line functions as the gate electrode for the transistor 1T. In an embodiment, the second terminal of the capacitor 1C is coupled to the ground electrode. As shown, the combination provides a memory cell with a 1T1C configuration. Furthermore, embodiments include a memory cell with a 1T1C configuration where the transistor 1T and the capacitor 1C are in the same plane.

Referring now to FIGS. 2A-2D, different plan view illustrations of memory cells with various capacitor configurations are shown, in accordance with various embodiments. It is to be appreciated that the capacitor configurations illustrated in FIGS. 2A-2D are exemplary in nature, and the capacitor may take any desired shape in order to provide a desired capacitance. Furthermore, the capacitor dielectric 264 is shown as being selectively deposited over only the capacitor electrode 268. Such an embodiment may be obtained with a high-k dielectric deposition that is selective to the conductive material of the capacitor electrode 268. However, it is to be appreciated that the capacitor dielectric 264 may also be conformally deposited. In such an embodiment, high-k dielectric material may also be present between insulating layer 212 and the ground electrode 262.

Figure 2A:
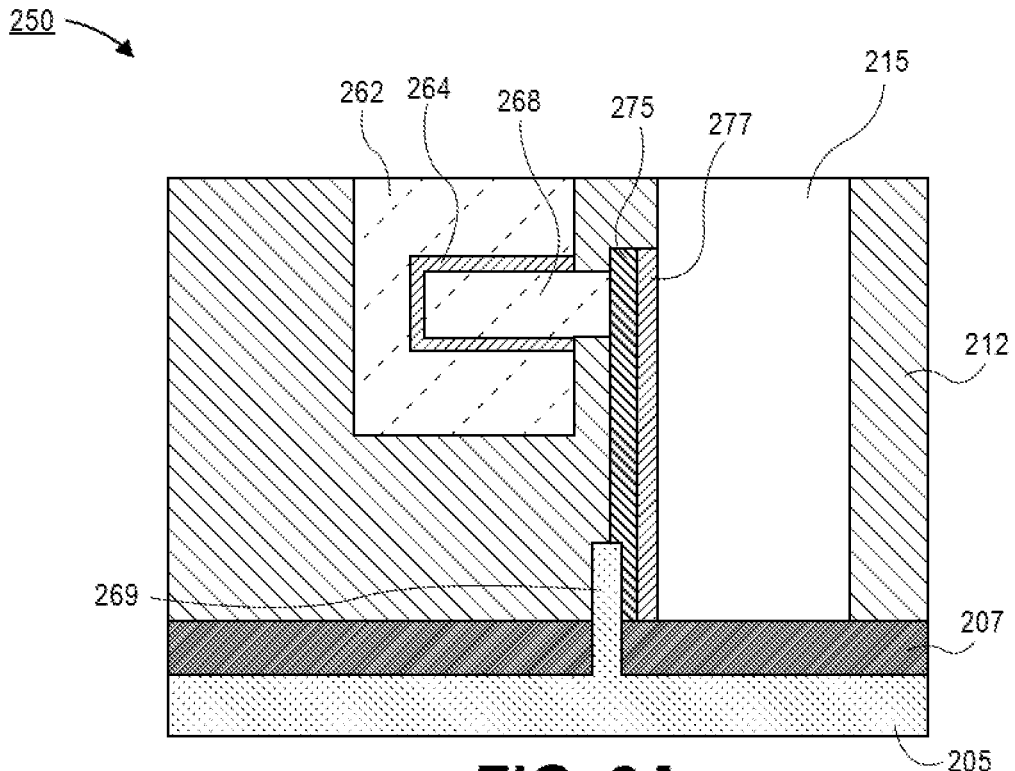
FIG. 2A is a plan view illustration of a memory cell in a 3D memory array, in accordance with an embodiment.

Referring now to FIG. 2A, a memory cell 250 that is substantially similar to the memory cells 150 shown in FIG. 1A is shown, in accordance with an embodiment. Particularly, the memory cell 250 may comprise a bit line 205, a spacer 207 along sidewalls of the bit line 205, a semiconductor channel 275, a gate dielectric 277, a word line 215, a capacitor electrode 268, a capacitor dielectric 264, and a ground electrode 262.

As shown, the semiconductor channel 275 may be coupled to the bit line 205 by an extension 269 from the bit line 205. The extension 269 may pass through the spacer 207 and directly contact the first end of the semiconductor channel 275. In an embodiment, the capacitor electrode 268 may contact the second end of the semiconductor channel 275 and extend out substantially orthogonal to the semiconductor channel 275. Accordingly, the capacitor electrode 268 may extend in a direction that is substantially parallel to the bit line 205. Similar to FIG. 1A, the capacitor dielectric 264 and the ground electrode 262 may form a U-shape that partially surrounds the capacitor electrode 268.

Figure 2B:
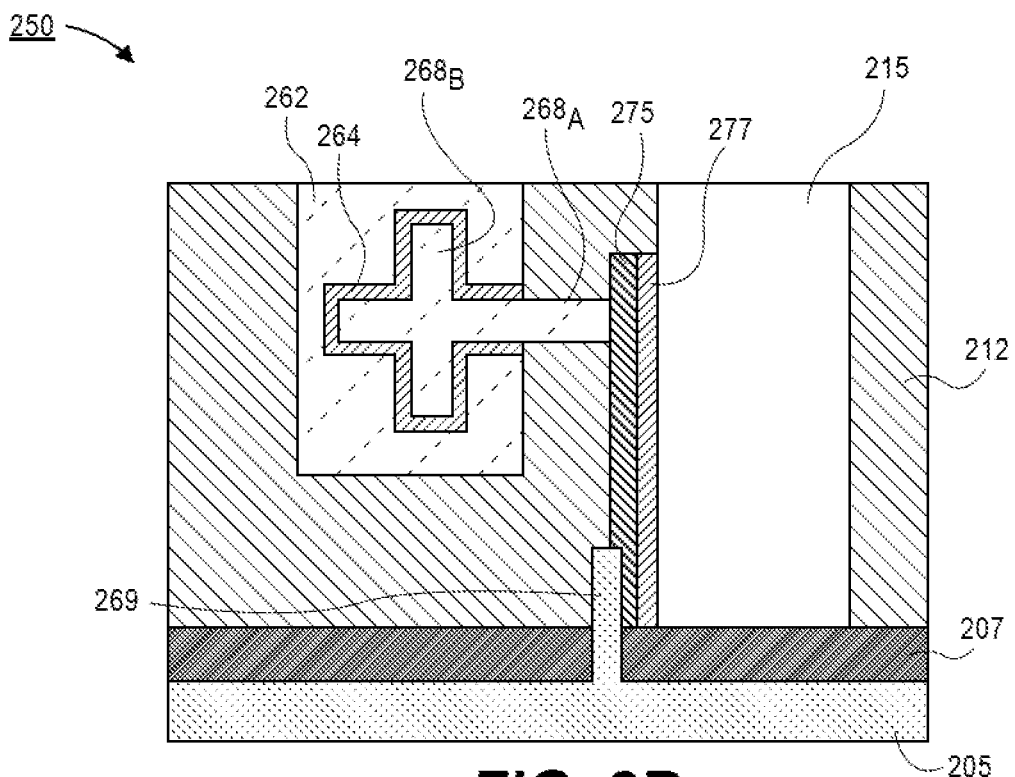
FIG. 2B is a plan view illustration of a memory cell in a 3D memory array with a cross-shaped capacitor, in accordance with an embodiment.

Referring now to FIG. 2B, a plan view illustration of a memory cell 250 with a cross-shaped capacitor electrode 268 is shown, in accordance with an embodiment. In an embodiment, the capacitor electrode 268 may comprise a first portion $268_A$ that extends substantially parallel to the bit line 205 and a second portion $268_B$ that extends substantially orthogonal to the bit line 205. The second portion $268_B$ of the capacitor electrode 268 may intersect the first portion $268_A$ of the capacitor electrode 268. In an embodiment, the use of such a capacitor configuration may provide increased surface area for the capacitor and improve the performance of the memory cell.

Figure 2C:
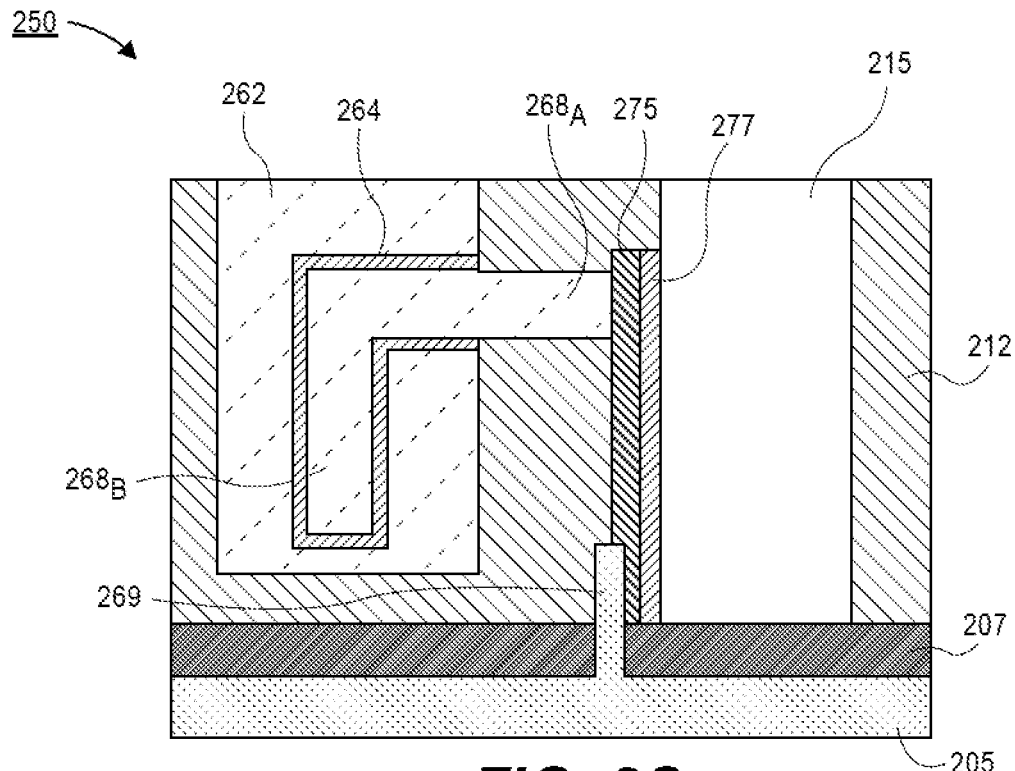
FIG. 2C is a plan view illustration of a memory cell in a 3D memory array with a capacitor that bends back towards the bit line, in accordance with an embodiment.

Referring now to FIG. 2C, a plan view illustration of a memory cell 250 with a capacitor electrode with a first portion $268_A$ and a second portion $268_B$ that extends back towards the bit line 205 is shown, in accordance with an embodiment. In an embodiment, the second portion $268_B$ and the first portion $268_A$ may intersect and be substantially orthogonal to each other. In an embodiment, the second portion $268_B$ extending back towards the bit line 205 may provide additional surface area to increase the capacitance.

Figure 2D:
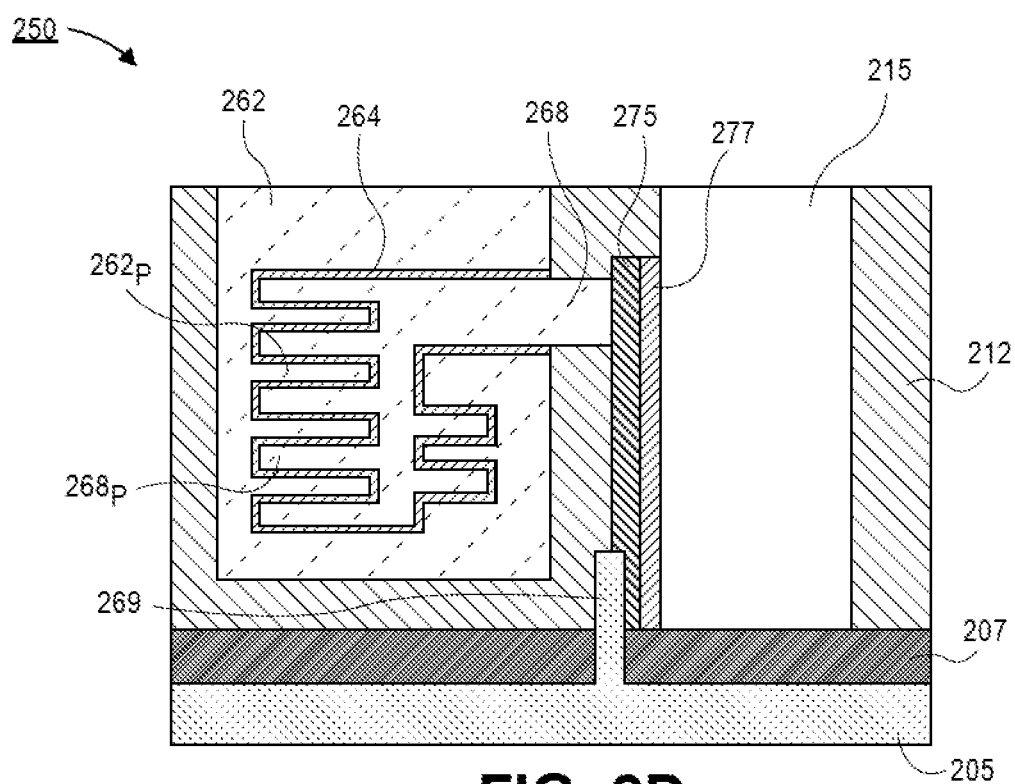
FIG. 2D is a plan view illustration of a memory cell in a 3D memory array with an interdigitated capacitor, in accordance with an embodiment.

Referring now to FIG. 2D, a plan view illustration of a memory cell 250 with a capacitor electrode 268 with a plurality of prongs $268_P$ that are interdigitated with prongs $262_P$ of the ground electrode 262 is shown, in accordance with an embodiment. In an embodiment, the interdigitated prongs $268_P$ and $262_P$ increase the surface area of the capacitor, and therefore, improves performance.

Figure 3A:
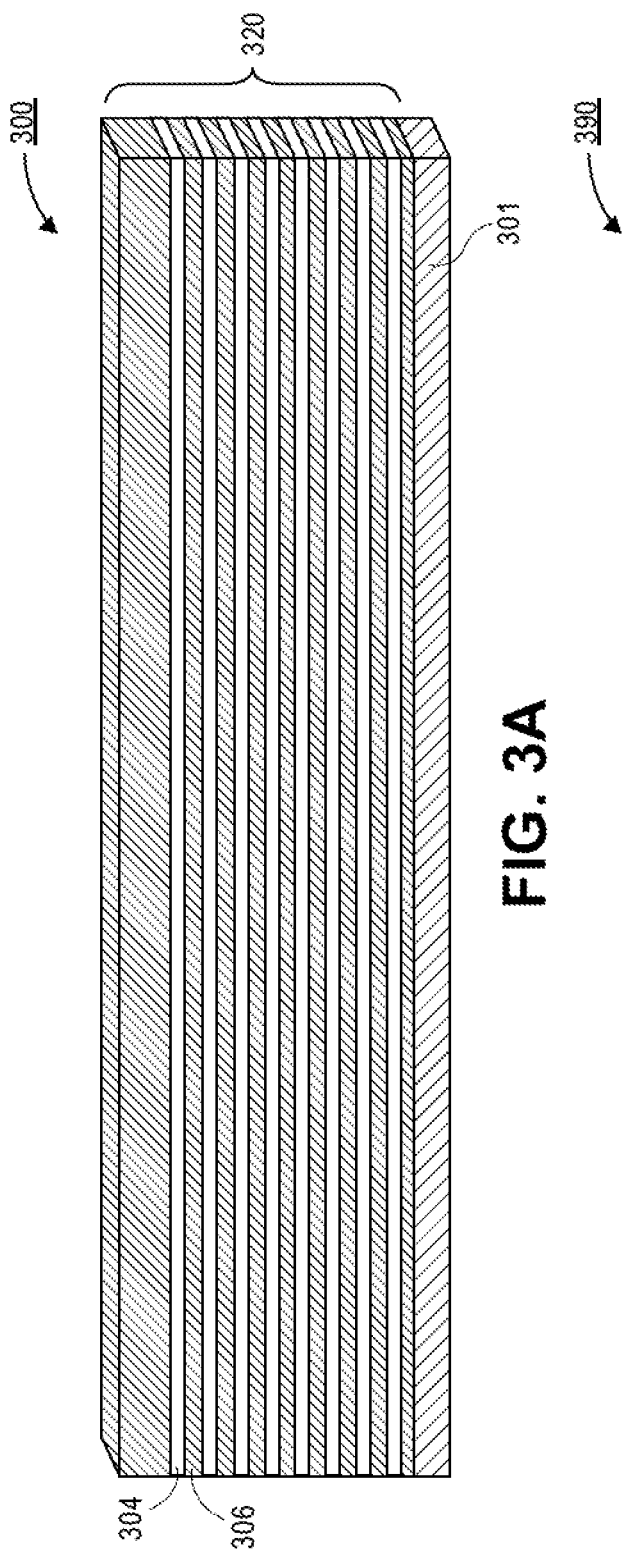
FIG. 3A is a perspective view illustration of a stack comprising a plurality of conductive layers alternating with a plurality of first insulating layers, in accordance with an embodiment.

Referring now to FIG. 3A a perspective view illustration of a stack 320 used to form a memory device 300 is shown, in accordance with an embodiment. In an embodiment, the stack 320 may be positioned over an underlying substrate 301. The underlying substrate 301 may be any substrate or layer. For example, the substrate 301 may be a device layer of a semiconductor die. In other embodiments the substrate 301 may be a metal layer in the BEOL stack of a die.

In an embodiment, the stack 320 may comprise a plurality of conductive layers 304 and a plurality of first insulator layers 306. The conductive layers 304 may be in an alternating pattern with the insulator layers 306. That is, in some embodiments each conductive layer 304 may be sandwiched between insulator layers 306. As will become evident in the following Figures, each conductive layer 304 will be used to fabricate a layer comprising a bit line and an array of memory cells. Accordingly, the stack 320 may be used to fabricate a 3D array of stacked memory cells.

Figure 3B:
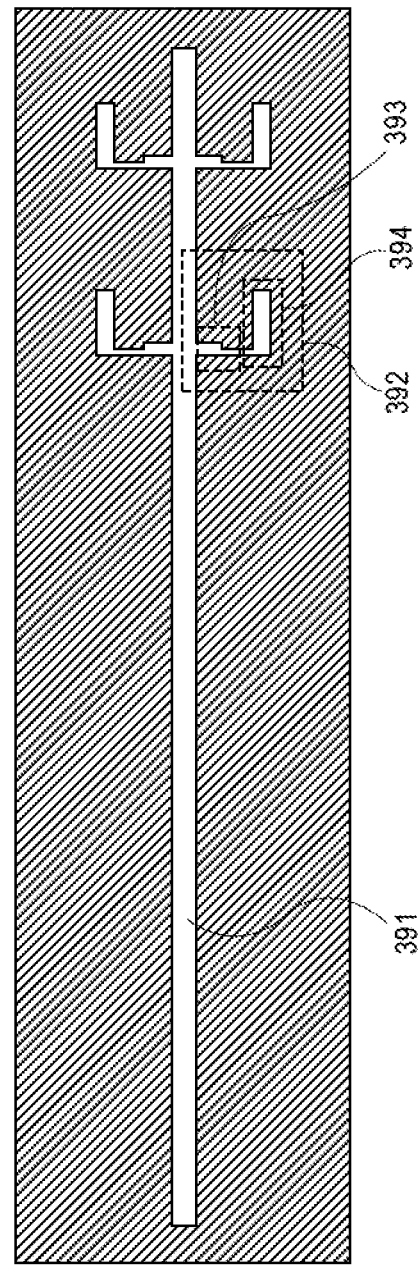
FIG. 3B is a plan view illustration of mask used to pattern the stack, in accordance with an embodiment.

Referring now to FIG. 3B, a plan view illustration of a mask 390 that may be used to pattern the stack 310 is shown, in accordance with an embodiment. In an embodiment, the mask 390 may include a bit line region 391 and a plurality of memory cell regions 392. The bit line region 391 may be an opening that is substantially rectangular in some embodiments. In an embodiment, four memory cell regions 392 are shown. However, it is to be appreciated that any number of memory cell regions 392 may be coupled to the bit line region 391.

In an embodiment, the memory cell region 392 may comprise openings for a transistor region 393 and a capacitor region 394. Particularly, the opening for the capacitor region is shown as being substantially rectangular. Such an opening may be used to form a capacitor similar to the capacitor configuration shown in FIG. 2A. However, it is to be appreciated that other capacitor configurations (e.g., similar to the capacitor configurations shown in FIGS. 2B-2D or any other configuration) may be made by changing the shape of the opening in the capacitor region 394.

Figure 4:
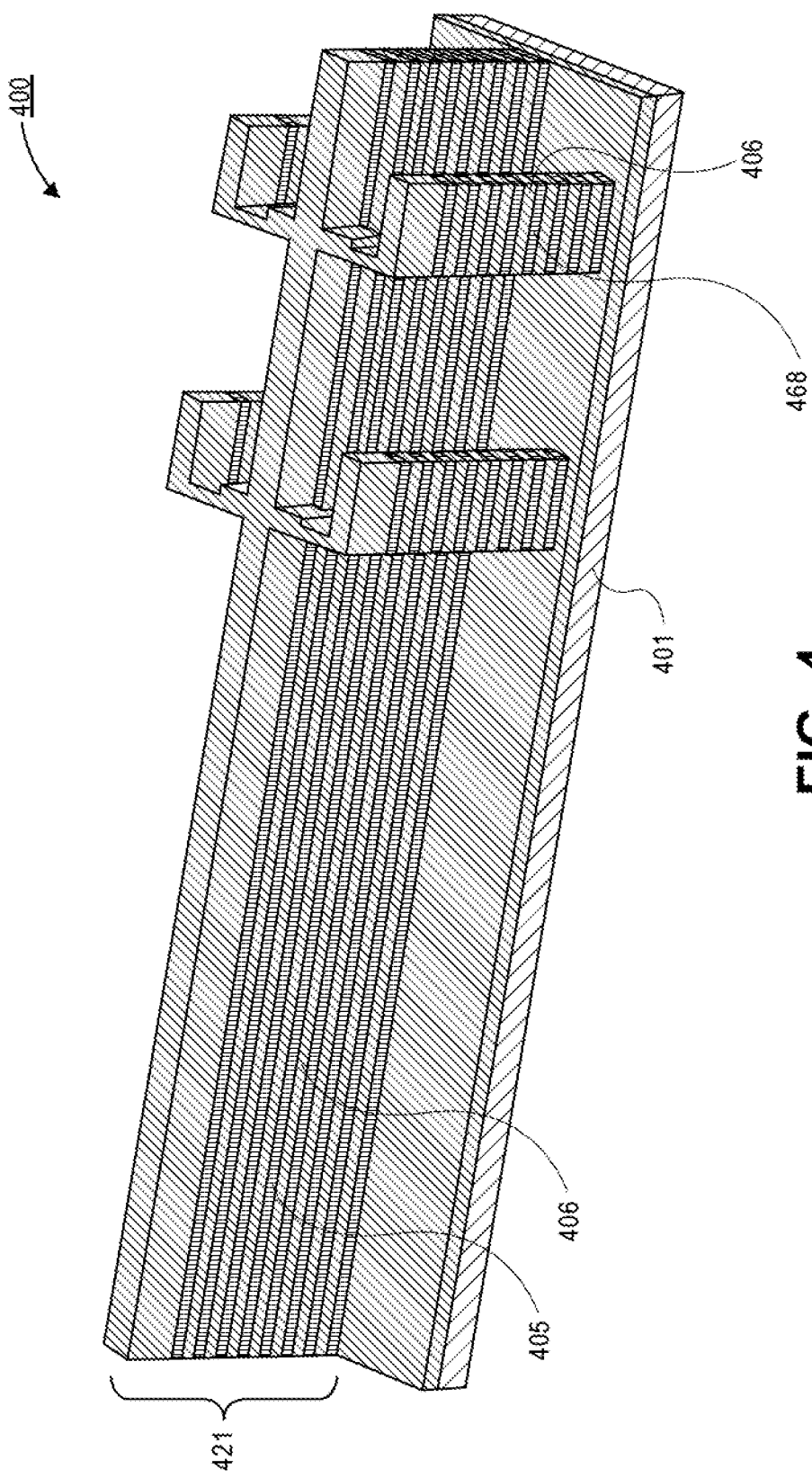
FIG. 4 is a perspective view illustration of the patterned stack that includes a bit line region and a memory cell region, in accordance with an embodiment.

Referring now to FIG. 4, a perspective view illustration of a memory device 400 after the stack is patterned (e.g., using a high aspect ratio etch process in conjunction with a mask 390) to form a patterned stack 421 is shown, in accordance with an embodiment. As shown, the bit line region 391 and the memory cell regions 392 of the mask 390 are transferred into the stack 320 to form the patterned stack 421. That is, each layer of the stack 320 is patterned substantially in parallel to form the patterned stack. Accordingly, only a single lithography operation is needed in order to form the patterned stack 421. In the illustrated embodiment, the substrate 401 may be covered by one of the first insulating layers 406. In other embodiments, the substrate 401 may be exposed.

In an embodiment, the patterned stack 421 may comprise a plurality of patterned layers. For example, the patterned conductive layers 304 may be patterned to form a bit line 405 and a plurality of memory cell regions. In the illustrated view in FIG. 4, a capacitor electrode 468 of the memory cell region is visible. While not visible in FIG. 4, it is to be appreciated that a sacrificial transistor region attaches the capacitor electrode 468 to the bit line 405. The sacrificial transistor region will be described in greater detail below. In an embodiment, the first insulating layers 406 are also patterned and match the profile of the bit line 405, the sacrificial channel region, and the capacitor electrode 468. For any given layer of the patterned stack 421, the bit line 405, the sacrificial transistor regions, and the capacitor electrodes 468 are all fabricated from the same conductive layer 304. Accordingly, a thickness of the bit line 405, the sacrificial transistor regions, and the capacitor electrodes 468 in each layer may be substantially uniform.

Figure 5:
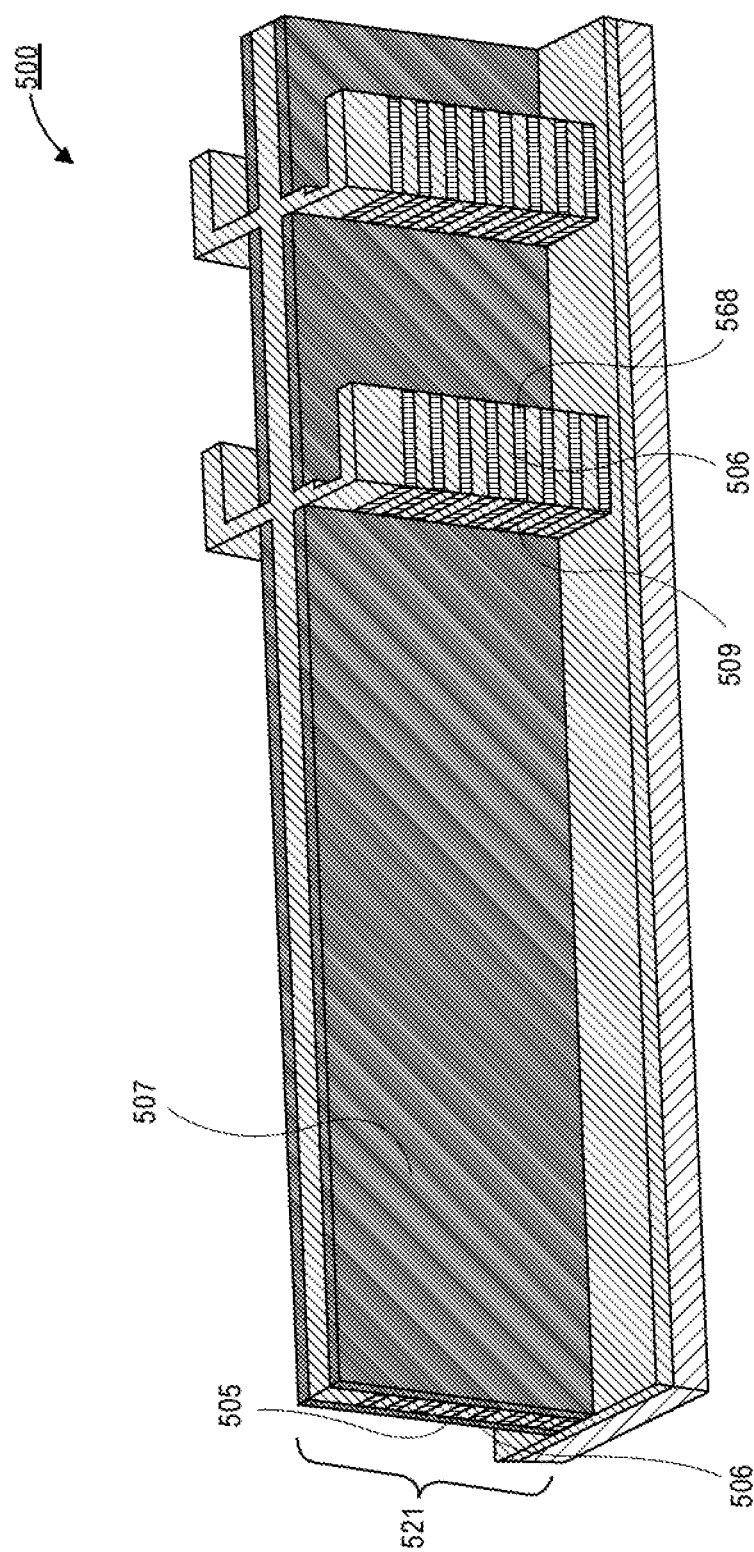
FIG. 5 is a perspective view illustration after a spacer layer is formed along sidewall surfaces of the bit line regions, in accordance with an embodiment.

Referring now to FIG. 5, a perspective view illustration of the memory device 500 after a spacer layer 507 is formed over the patterned stack 521 is shown, in accordance with an embodiment. In an embodiment, the spacer layer 507 may be formed with a spacer deposition and etching process, as is known in the art. The spacer 507 may be formed along sidewall surfaces of the bit lines 505 and the patterned first insulator layers 506. As shown, the memory cell region may be connected to the bit line 505 by passing through the spacer 507. For example, the sacrificial channel region 509 may couple the capacitor electrode 568 to the bit line 505.

Figure 6A:
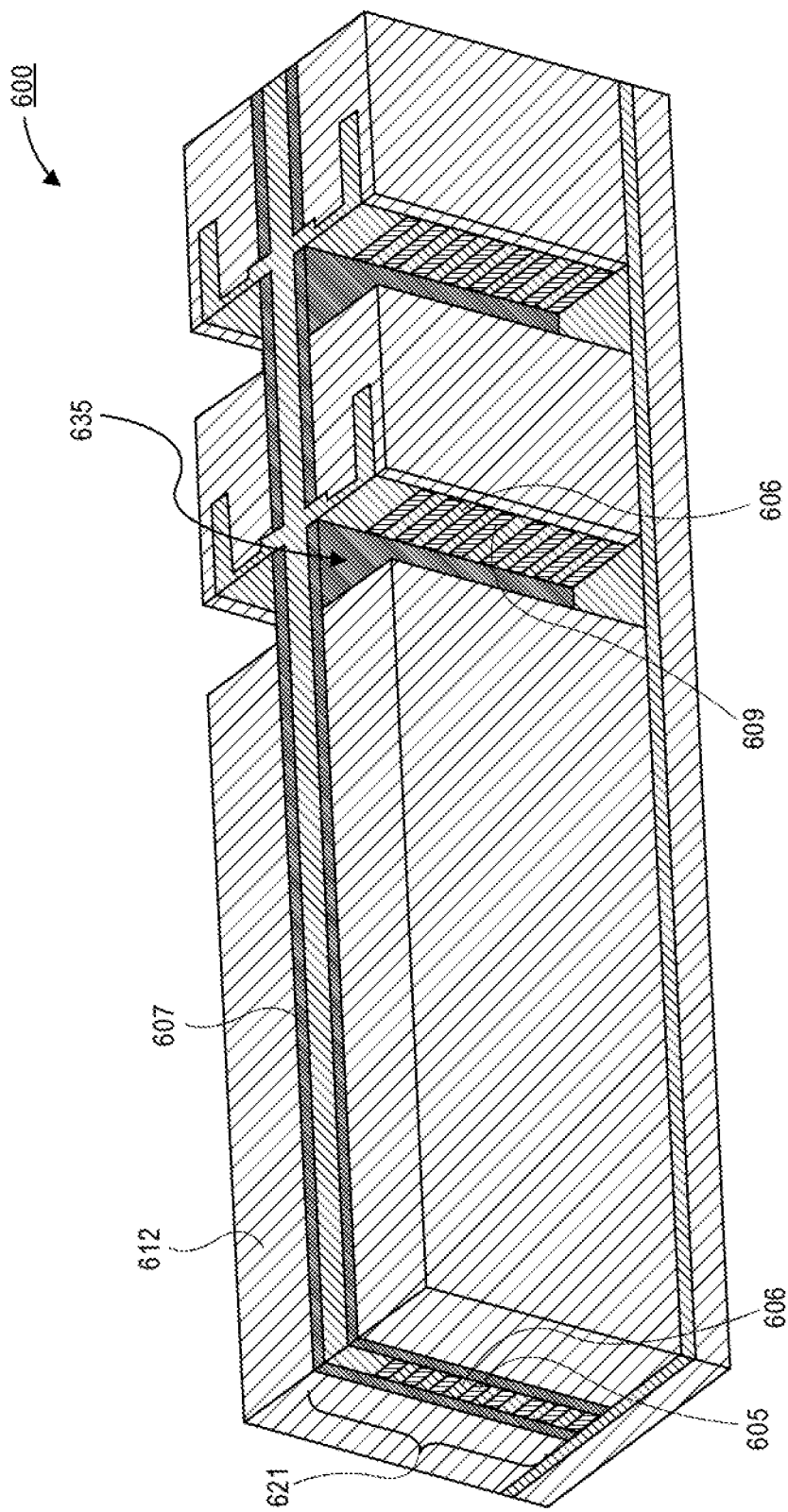
FIG. 6A is a perspective view illustration after a second insulating layer is disposed over the patterned stack and first trenches are formed to expose transistor regions.

Referring now to FIG. 6A, a perspective view illustration of the memory device 600 after a second insulating layer 612 is formed over the patterned stack 621 and first trenches 635 are formed is shown, in accordance with an embodiment. In an embodiment, the second insulating layer 612 may be deposited with any suitable blanket deposition process and polished back to be substantially coplanar with a top surface of the patterned stack 621. In an embodiment, first trenches 635 may be formed through the second insulating layer 612 to expose sacrificial channel regions 609 of the memory cells. In an embodiment, the second insulating layer 612 is etch selective to the first insulating layers 606 and the conductive material.

In an embodiment, the first trenches 635 expose a word line region. Particularly, the sacrificial channel region 609 is exposed while the bit line 605 and the capacitor electrode (not shown in FIG. 6A) remain protected by the first insulating layers 606, the spacers 607, and/or the second insulating layer 612. In an embodiment, the first trenches 635 extend completely through the second insulating layer 612 in order to expose the sacrificial channel regions 609 in each layer of the stack 621. The number of first trenches 635 may match the number of memory cells in each layer. For example, four first trenches 635 are shown in FIG. 6A. However, it is to be appreciated that if additional or fewer memory cells are formed in each layer, then more or fewer first trenches 635 may be used.

Figure 6B:
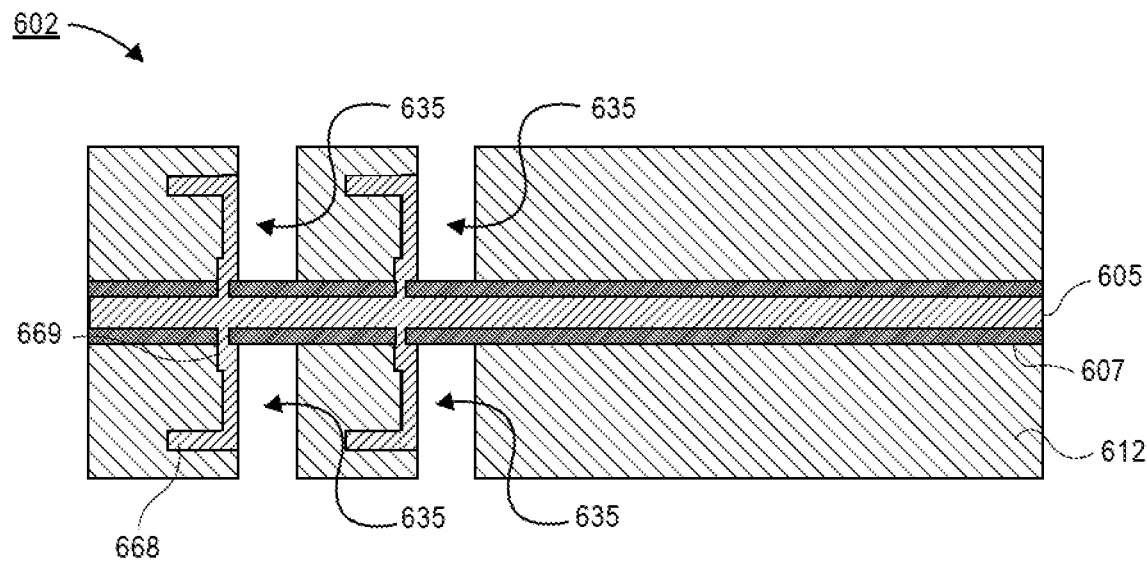
FIG. 6B is a plan view illustration of a layer of the patterned stack in FIG. 6A, in accordance with an embodiment.

Referring now to FIG. 6B, a plan view illustration of a single layer 602 of the patterned stack 621 in FIG. 6A is shown, in accordance with an embodiment. As shown, the first trenches 635 expose the sacrificial channel region 609 that attaches the capacitor electrode 668 to the bit line 605.

Figure 6C:
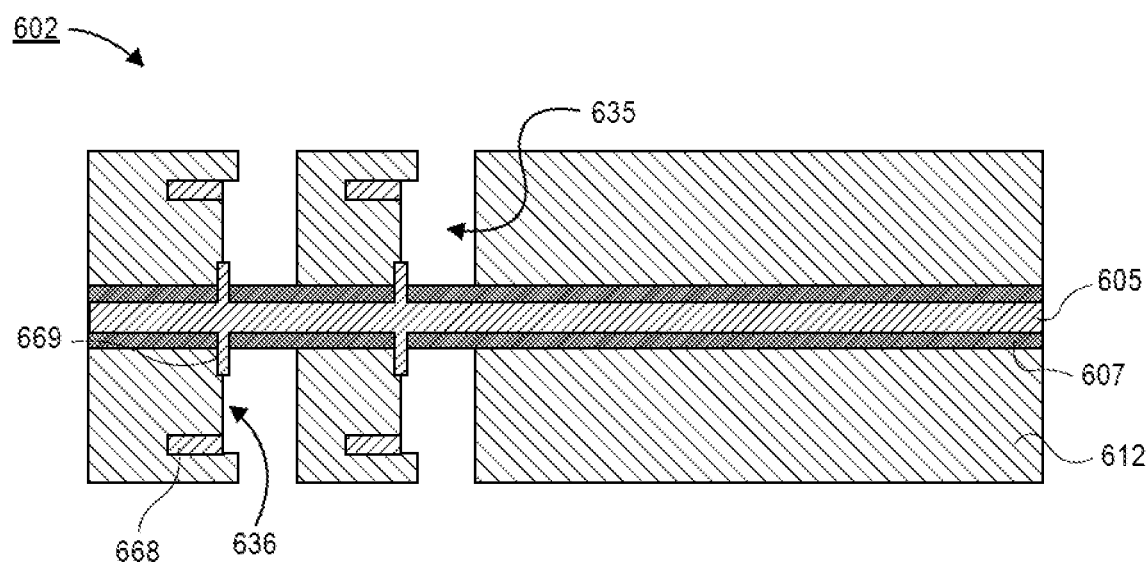
FIG. 6C is a plan view illustration after sacrificial channel regions are removed with a cavity etch, in accordance with an embodiment.

Referring now to FIG. 6C, a plan view illustration of a layer 602 after the sacrificial channel 609 is removed is shown, in accordance with an embodiment. In an embodiment, the sacrificial channel 609 may be removed with an etching process. The etching process may be referred to as a cavity etch process since the removal of the sacrificial channel 609 leaves a cavity 636 between layers of the first sacrificial layers (which are above and below the plane illustrated in FIG. 6C). As shown in FIG. 6C, the cavity 636 is shown as a recess that separates the capacitor electrode 668 from an extension 669 out from the bit line 605. In an embodiment, the cavity etch process may be a timed wet etch.

Figure 6D:
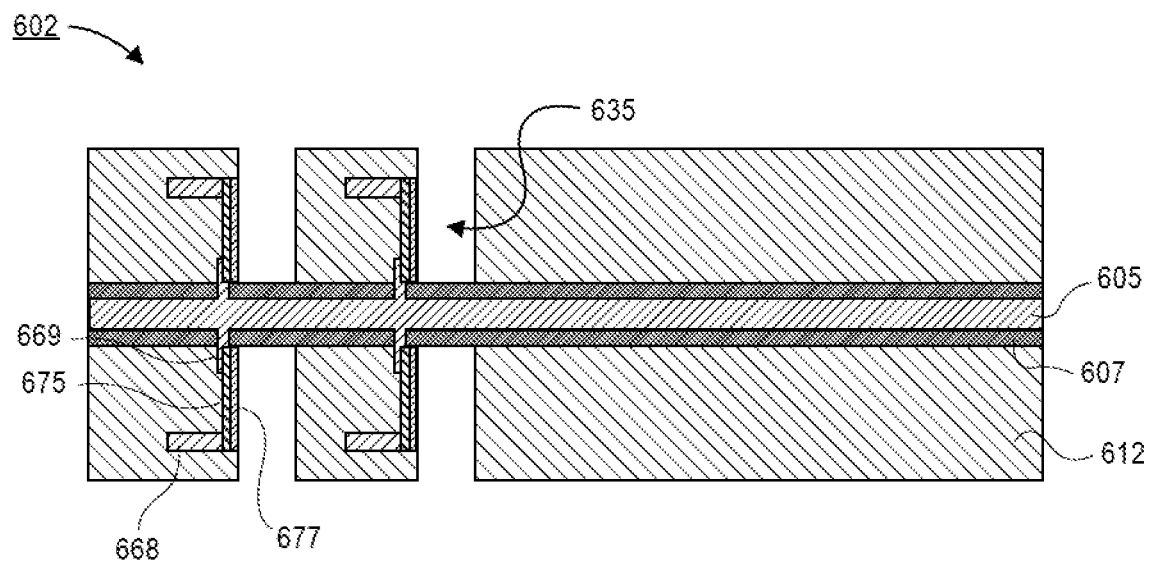
FIG. 6D is a plan view illustration after the semiconductor channel and the gate dielectric are disposed in the cavities, in accordance with an embodiment.

Referring now to FIG. 6D, a plan view illustration of a layer after the semiconductor channel 675 and the gate dielectric layer 677 are formed is shown, in accordance with an embodiment. In an embodiment, the semiconductor channel 675 may be deposited with a conformal deposition process followed by a dry etch to vertically planarize the surface of the semiconductor channel 675 with the edge of the cavity 636. In some embodiments, the semiconductor channel 675 may completely fill the cavity 636 and the gate dielectric 677 is deposited over the semiconductor channel 675, but outside the cavity 636. In other embodiments (such as what is shown in FIG. 6D) the semiconductor channel 675 does not completely fill the cavity 636 and the gate dielectric 677 is also formed in the cavity 636. In an embodiment, the extension 669 from the bit line 605 contacts a first end of the semiconductor channel 675 and the capacitor electrode 668 contacts a second end of the semiconductor channel 675 opposite from the first end.

Figure 6E:
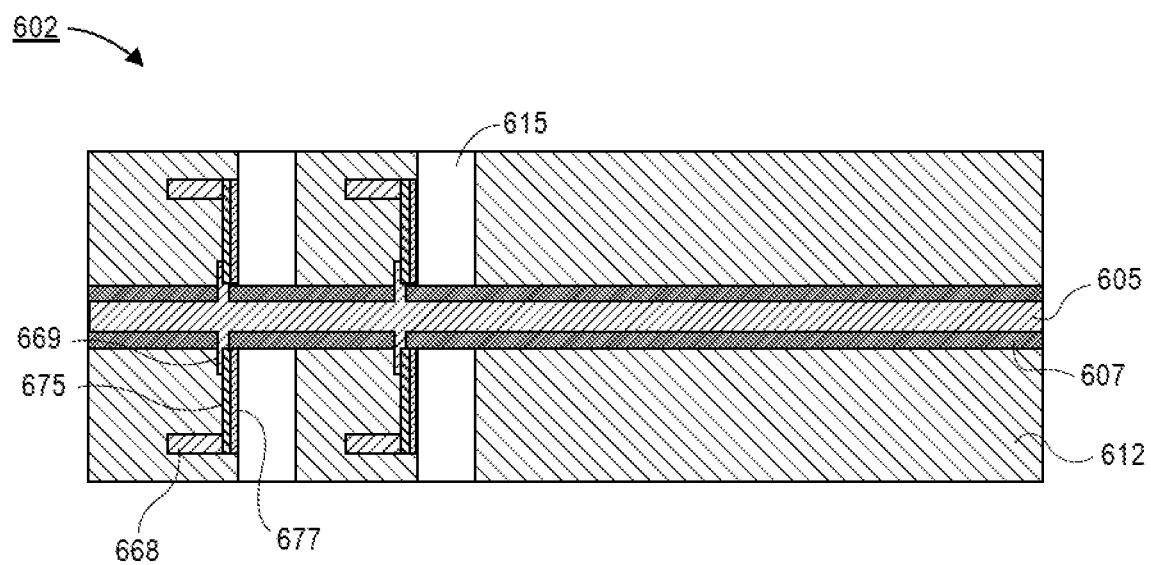
FIG. 6E is a plan view illustration after word lines are disposed in the first trenches, in accordance with an embodiment.

Referring now to FIG. 6E, a plan view illustration of the layer 602 after word lines 615 are formed in the first trenches is shown, in accordance with an embodiment. In an embodiment, the word lines 615 may be formed with any suitable conductive material. The word lines 615 contact the gate dielectrics 677 and function as the gate electrode for the semiconductor channel 675.

Figure 7:
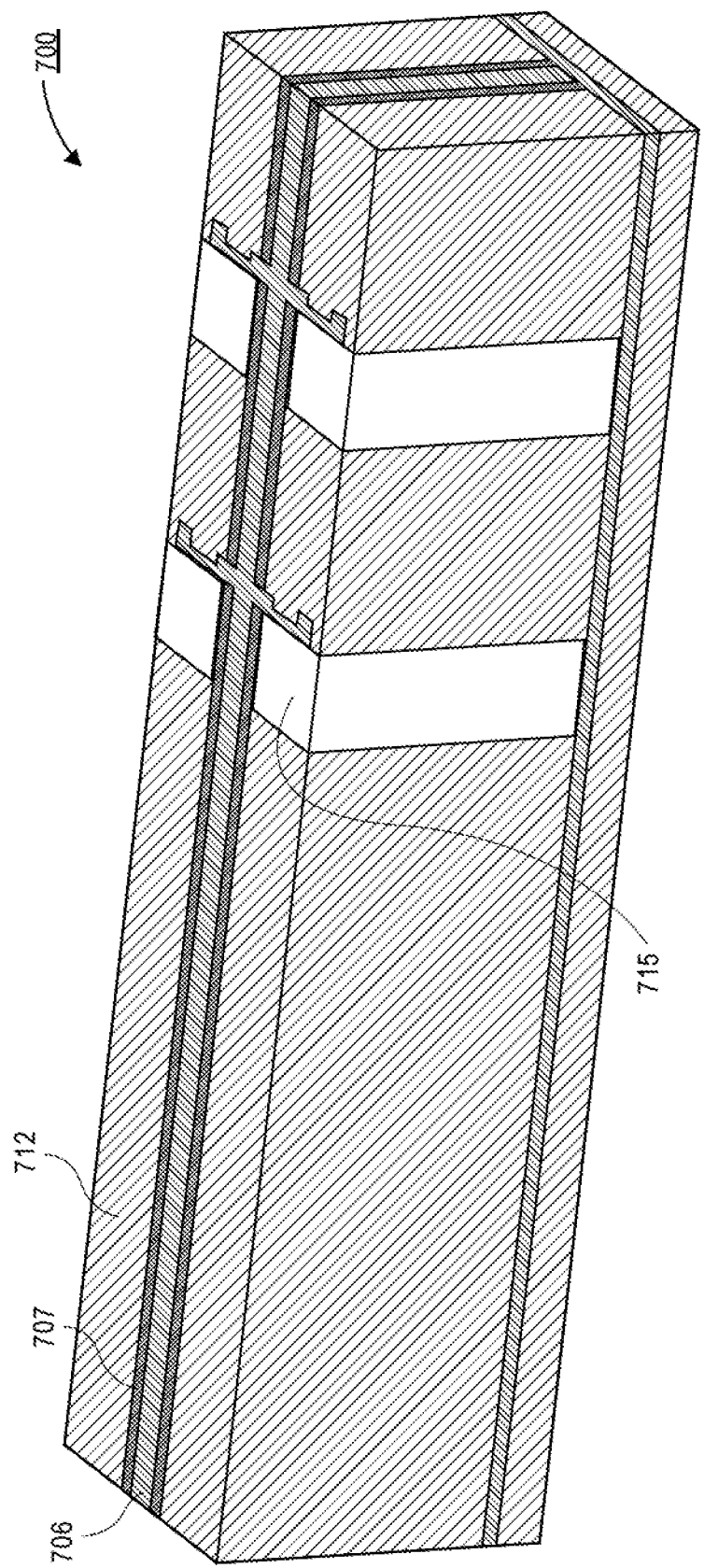
FIG. 7 is a perspective view illustration of the patterned stack after word lines are disposed in the first trenches, in accordance with an embodiment.

Referring now to FIG. 7, a perspective view illustration of the memory device 700 after the word lines 715 are formed is shown, in accordance with an embodiment. As shown, the word lines 715 extend in a direction that is substantially orthogonal to the bit lines (not visible in FIG. 7). Accordingly, each word line 715 may be the gate electrode for a plurality of memory cells stacked vertically over each other.

In an embodiment, the word lines 715 may be in contact with the spacer 707 and the second insulator layer 712 may encapsulate a portion of the perimeter of the word lines 715.

Figure 8A:
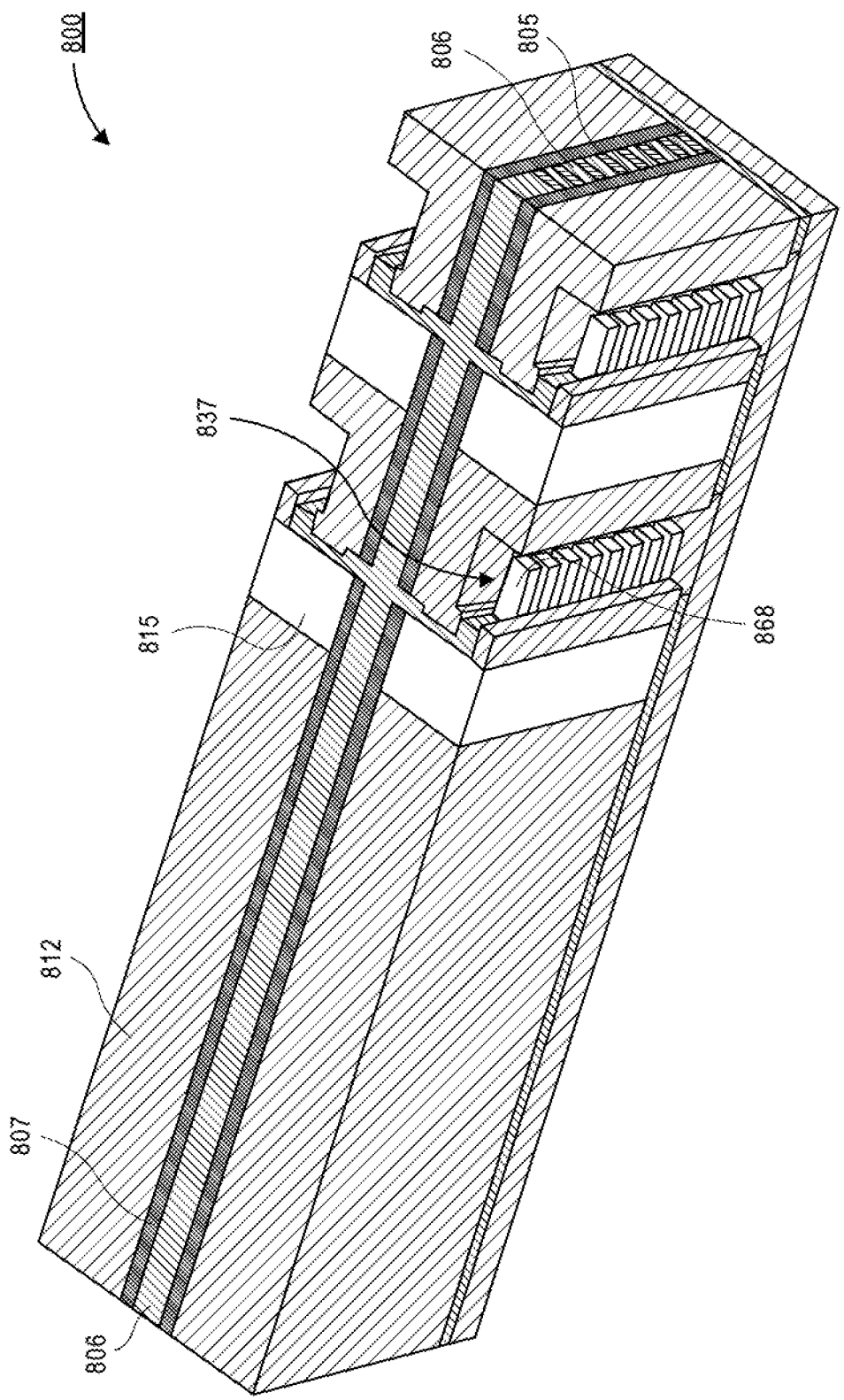
FIG. 8A is a perspective view illustration after second trenches are formed through the second insulating layer to expose capacitor regions, in accordance with an embodiment.

Referring now to FIG. 8A, a perspective view illustration of the memory device 800 after second trenches 837 are formed in the second dielectric layer 812 is shown, in accordance with an embodiment. In an embodiment, the second trenches 837 may expose the capacitor region of each memory cell. Particularly, the capacitor electrodes 868 of each memory cell are exposed, and the bit lines 805, the semiconductor channel (not visible), and the gate dielectric (not visible) remain covered (e.g., by one or more of the first insulator layers 806, the spacer 807, the word lines 815, and/or the second insulator layer 812). In an embodiment, the second trenches 837 may be formed with a first etching process that removes the second insulating layer 812 and a second etching process that removes the first insulating layers 806 between the capacitor electrodes 868.

Figure 8B:
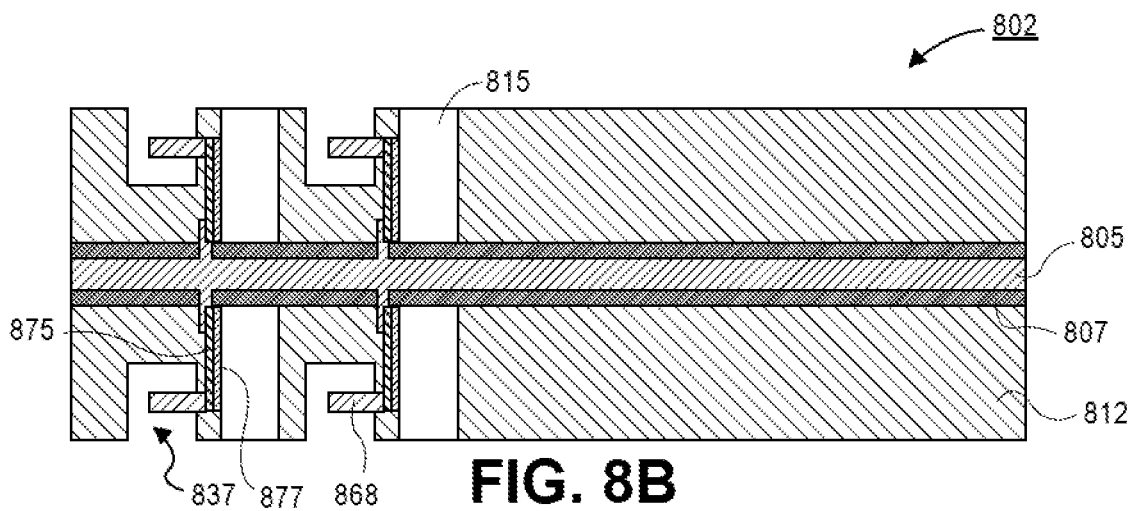
FIG. 8B is a plan view illustration of a layer of the patterned stack in FIG. 8A, in accordance with an embodiment.

Referring now to FIG. 8B, a plan view illustration of a layer 802 of the memory device after the second trenches 837 are formed is shown, in accordance with an embodiment. As shown, the capacitor electrodes 868 extend from the semiconductor channel 875 out through a sidewall of the second trenches 837. Accordingly, at least a portion of the capacitor electrodes 868 may be outside of the second trenches 837.

Figure 8C:
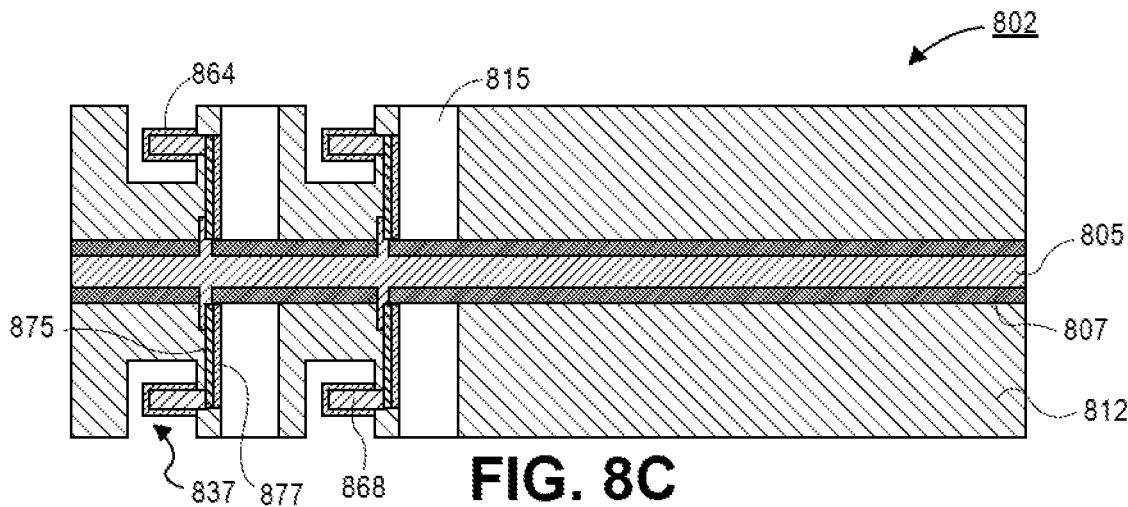
FIG. 8C is a plan view illustration after a capacitor dielectric is disposed over the capacitor electrodes, in accordance with an embodiment.

Referring now to FIG. 8C, a plan view illustration of the layer 802 after a capacitor dielectric layer 864 is formed over the exposed portions of the capacitor electrodes 868. In an embodiment, the capacitor dielectric layer 864 may be deposited with a conformal deposition process. In the illustrated embodiment the capacitor dielectric layer 864 is only shown over the capacitor electrodes 868 for simplicity. Such an embodiment may be obtained when the deposition of capacitor dielectric 864 is preferentially deposited on the capacitor electrodes 868. However, it is to be appreciated that the capacitor dielectric 864 may also line the sidewalls of the second trenches (e.g., when a conformal deposition of the capacitor dielectric 864 is used). In an embodiment, the capacitor dielectric 864 may form a U-shape around the capacitor electrode 868. While not visible in FIG. 8C, it is to be appreciated that the capacitor dielectric 864 may also be deposited over top surfaces and bottom surfaces of the capacitor electrodes 868.

Figure 8D:
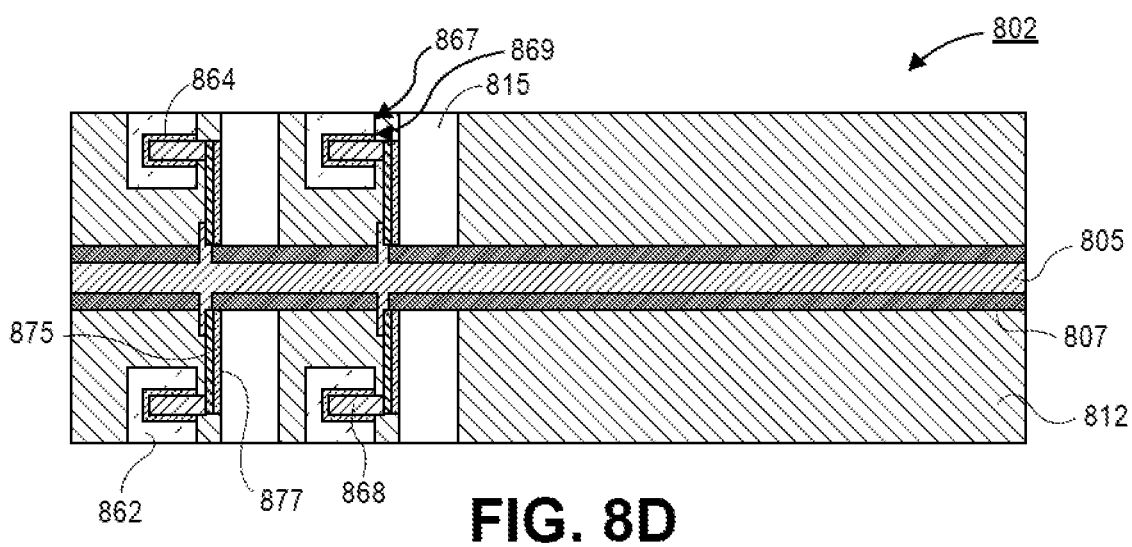
FIG. 8D is a plan view illustration after ground electrodes are disposed in the second trenches, in accordance with an embodiment.

Referring now to FIG. 8D, a plan view illustration of the layer 802 after the second trenches 837 are filled with a conductive material to form the ground electrodes 862 is shown, in accordance with an embodiment. In an embodiment, the ground electrodes 862 may fill the second trenches 837 and form a U-shape around the capacitor electrode 868. Since the ground electrode 862 and the capacitor dielectric 864 are both defined by the second trenches 837, surface 867 of the ground electrode 862 and surface 869 of the capacitor dielectric 864 may be substantially coplanar with each other.

Figure 8E:
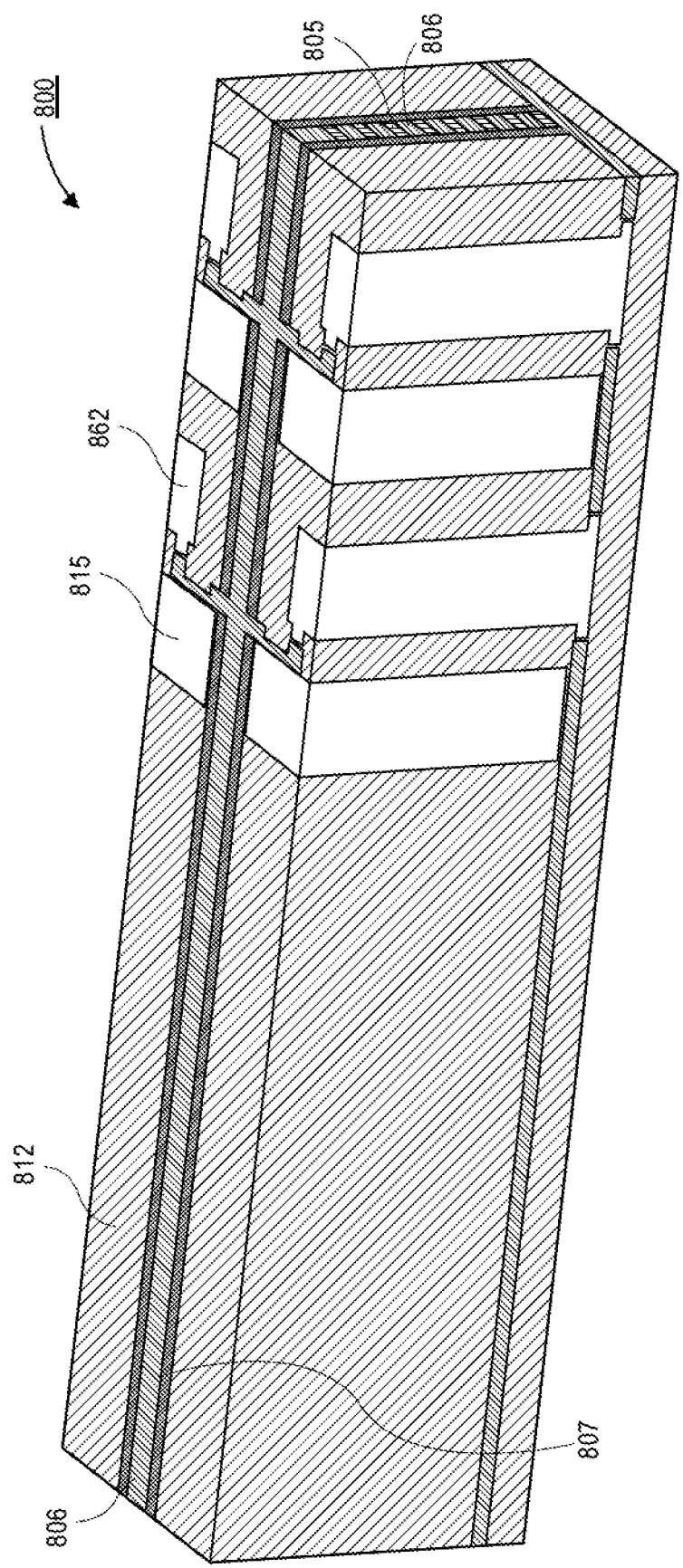
FIG. 8E is a perspective view illustration of the patterned stack after the ground electrodes are disposed in the second trenches, in accordance with an embodiment.

Referring now to FIG. 8E, a perspective view illustration of the memory device after the ground electrodes 862 are formed is shown, in accordance with an embodiment. As shown, the ground electrodes 862 extend in a direction that is substantially parallel to the word lines 815, and orthogonal to the bit lines 805. Accordingly, the ground electrodes 862 may serve as the ground electrode for a plurality of memory cells in a vertical stack.

Figure 9:
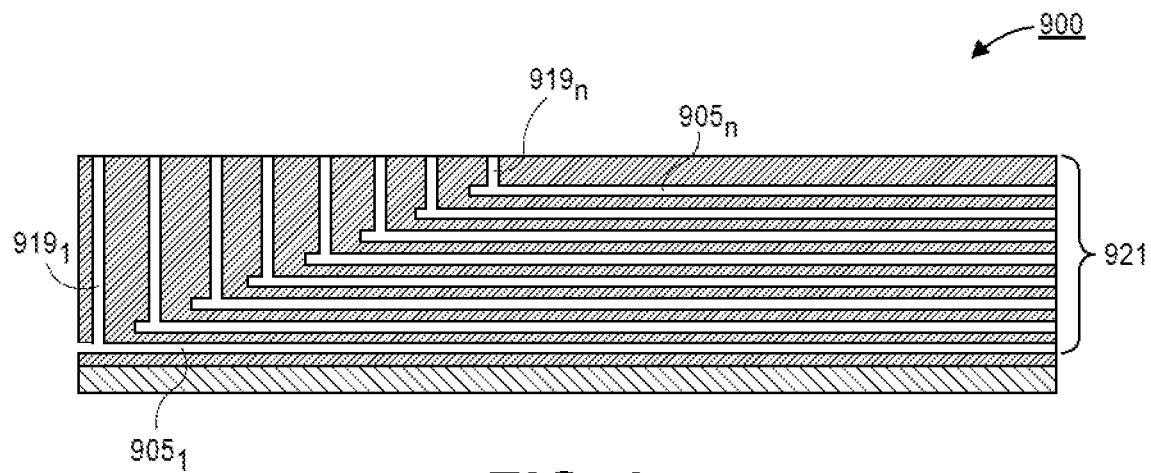
FIG. 9 is a cross-sectional illustration of the patterned stack showing a staircase configuration of the stacked bit lines, in accordance with an embodiment.

Referring now to FIG. 9, a cross-sectional illustration of the patterned stack 921 of memory device 900 along the bit lines 905 is shown after interconnects 919 to each bit line 905 are formed is shown, in accordance with an embodiment. In an embodiment, the bit lines $905_{1-n}$ may have a stair step pattern. That is, each of the bit lines may have a progressively shorter length with each successive layer. For example, bit line $905_1$ is the longest bit line 905 and bit line $905_n$ is the shortest bit line 905. The stair step pattern may be formed with an etching process known in the art. Accordingly, interconnects $919_{1-n}$ have clearance to land on the corresponding bit line $905_{1-n}$.

Figure 10:
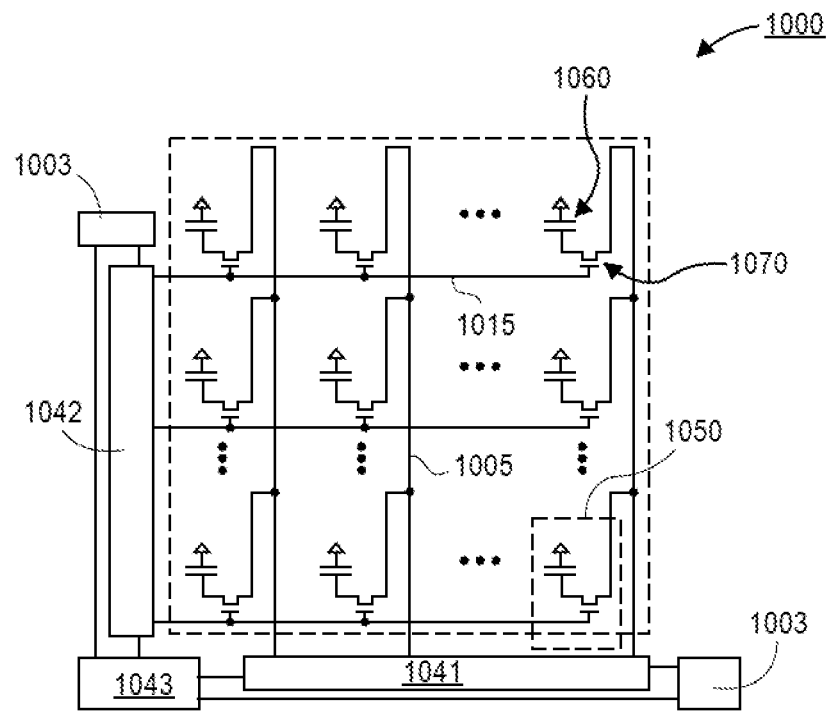
FIG. 10 is a schematic of the circuitry of a memory device, in accordance with an embodiment.

Referring now to FIG. 10, a schematic electrical diagram of a memory device 1000 and control circuitry that may be used in conjunction with memory devices (e.g., memory devices disclosed in FIGS. 1A-9) is shown. In an embodiment memory device 1000 may include memory cells 1050 with capacitors 1060 and transistors 170, in accordance with various embodiments. The memory cells 1050, and their interconnections, may take the form of any of the embodiments disclosed herein. The memory device 1000 of FIG. 10 may be a bidirectional cross-point array in which each column is associated with a bit line 1005 driven by column select circuitry 1041. Each row may be associated with a word line 1015 driven by row select circuitry 1042. During operation, read/write control circuitry 1043 may receive memory access requests (e.g., from one or more processing devices or communication chips of an electrical device), and may respond by generating an appropriate control signal (e.g., read, write 0, or write 1), as known in the art. The read/write control circuitry 1043 may control the row select circuitry 1042 and the column select circuitry 1041 to select the desired memory cell(s) 1050. Voltage supplies 1003 may be controlled to provide the voltage(s) necessary to bias the memory device 1000 to facilitate the requested action on one or more memory cells 1050. Row select circuitry 1042 and column select circuitry 1041 may apply appropriate voltages across the memory array 1000 to access the selected memory cells 1050 (e.g., by providing appropriate voltages to the memory cells 1050 to allow the desired transistors 1070 to conduct current). The read/write control circuit 1043 may include sense amplifier circuitry, as known in the art. Row select circuitry 1042, column select circuitry 1041, and read/write control circuitry 1043 may be implemented using any devices and techniques known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
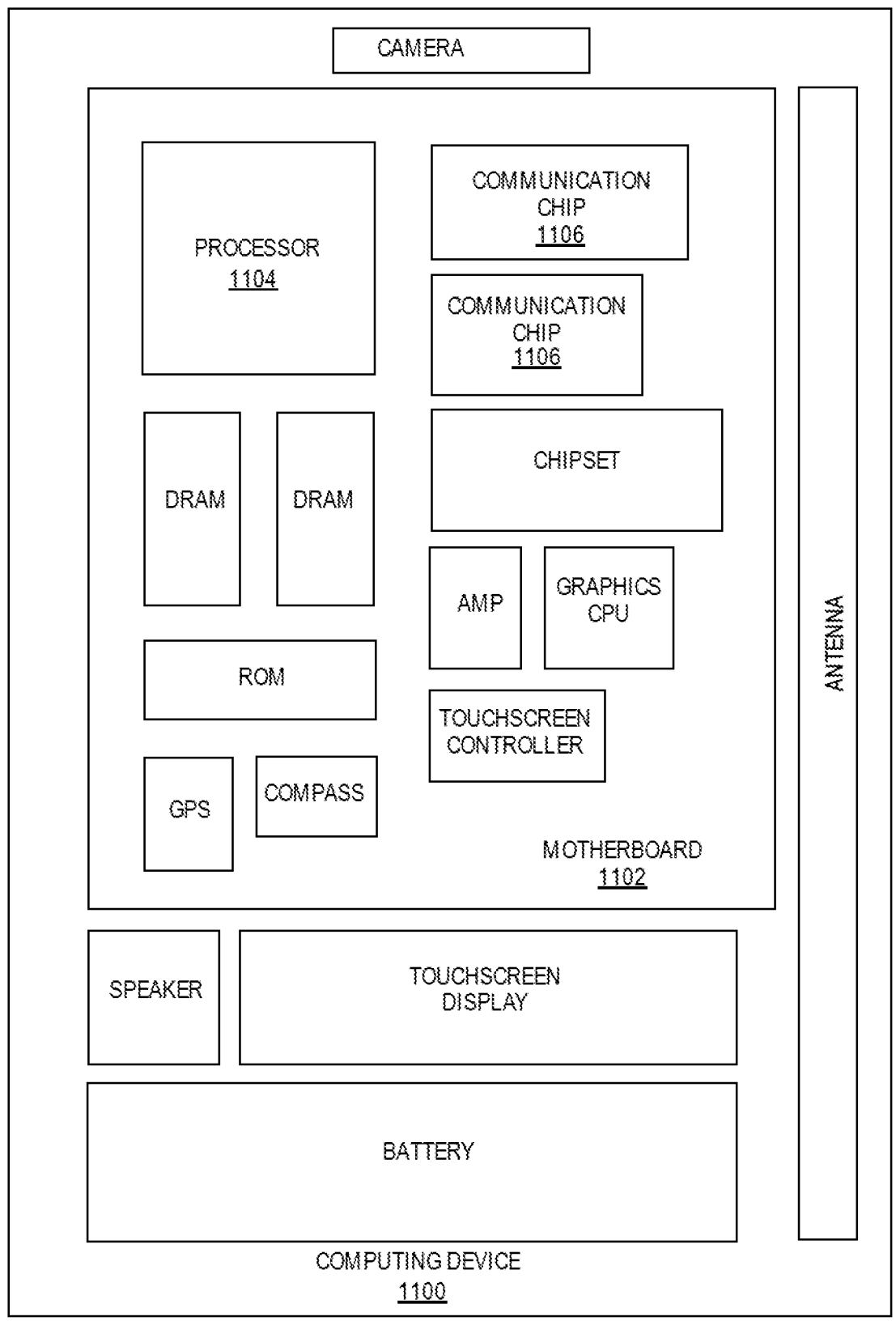
FIG. 11 illustrates a computing device in accordance with one implementation of an embodiment of the disclosure.

FIG. 11 illustrates a computing device 1100 in accordance with one implementation of an embodiment of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In an embodiment, the integrated circuit die of the processor may comprise a 3D stacked DRAM array in the BEOL metal layers, as described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In an embodiment, the integrated circuit die of the communication chip may comprise a 3D stacked DRAM array in the BEOL metal layers, as described herein.

In further implementations, another component housed within the computing device 1100 may comprise a 3D stacked DRAM array in the BEOL metal layers, as described herein.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
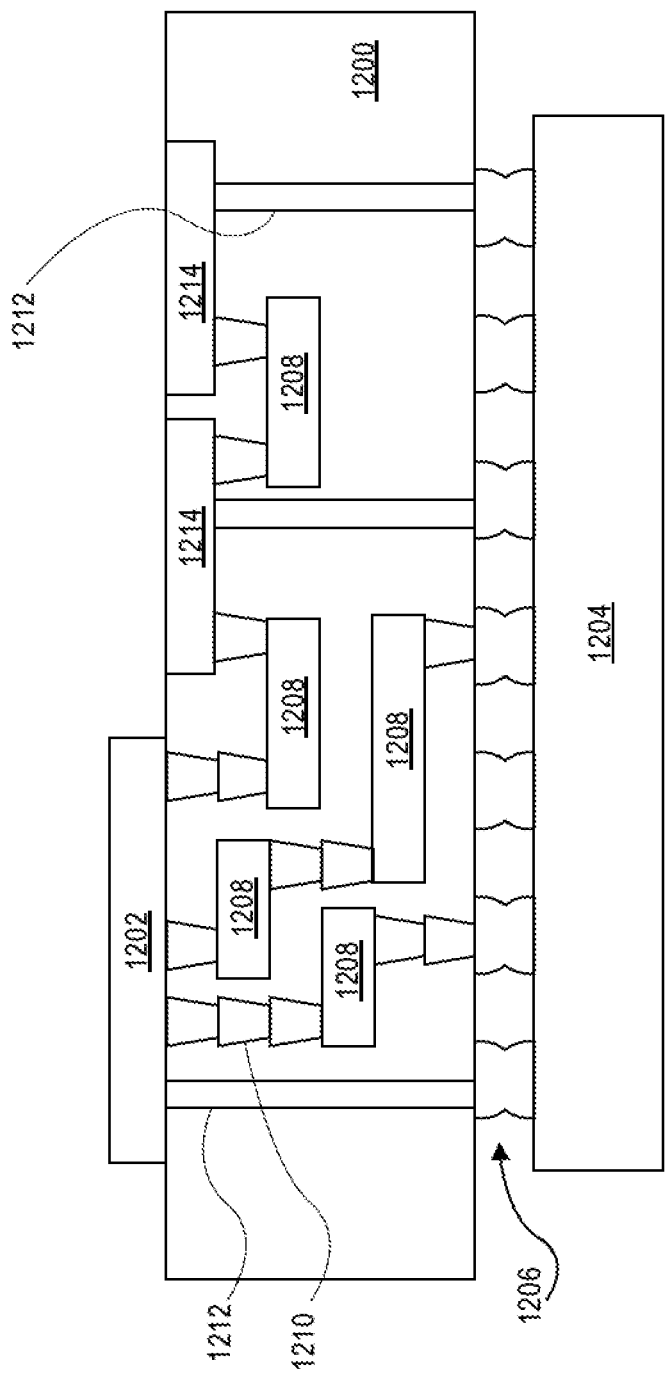
FIG. 12 is an interposer implementing one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200.

Thus, embodiments of the present disclosure comprise a 3D stacked DRAM array in the BEOL metal layers of a die, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a memory device, comprising: a substrate surface; and a three-dimensional (3D) array of memory cells over the substrate surface, wherein each memory cell comprises a transistor and a capacitor, wherein the transistor of each memory cell comprises: a semiconductor channel, wherein a first end of the semiconductor channel is electrically coupled to a bit line that runs substantially parallel to the substrate surface, and a second end of the semiconductor channel is electrically coupled to the capacitor; and a gate dielectric on a surface of the semiconductor channel between the first end and the second end of the semiconductor channel, wherein the gate dielectric is contacted by a word line that runs substantially perpendicular to the substrate surface.

Example 2: the memory device of Example 1, further comprising: a plurality of bit lines in a stack, wherein the bit lines are separated by insulating layers.

Example 3: the memory device of Example 1 or Example 2, wherein the plurality of bit lines comprises eight or more bit lines.

Example 4: the memory device of Examples 1-3, wherein each bit line is electrically coupled to two or more semiconductor channels.

Example 5: the memory device of Examples 1-4, further comprising: a spacer along sidewall surfaces of the plurality of bit lines.

Example 6: the memory device of Examples 1-5, wherein the plurality of bit lines terminate in a stair step pattern.

Example 7: the memory device of Examples 1-6, wherein the semiconductor channels are thin-film semiconductor channels.

Example 8: the memory device of Examples 1-7, wherein each capacitor comprises: a capacitor electrode electrically coupled to the second end of the semiconductor channel; a capacitor dielectric over the capacitor electrode; and a drain electrode.

Example 9: the memory device of Examples 1-8, wherein the capacitor electrode and the drain electrode have interdigitated surfaces.

Example 10: the memory device of Examples 1-9, wherein a plurality of capacitors share the same drain electrode.

Example 11: the memory device of Examples 1-10, wherein the drain electrode extends in a direction parallel to the word line.

Example 12: the memory device of Examples 1-11, wherein the capacitor electrodes have a thickness that is equal to a thickness of the bit line.

Example 13: a method of forming a memory device, comprising: forming a stack comprising a plurality of conductive layers alternating with first insulating layers; patterning the stack, wherein each conductive layer is patterned to form a bit line and an array of memory cell regions, each memory cell region comprising: a transistor region having a sacrificial channel formed of the conductive layer; and a capacitor region having a capacitor electrode formed of the conductive layer and connected to the sacrificial channel; forming spacers along sidewalls of the bit lines; disposing a second insulating layer over the patterned stack and the spacers; forming first trenches through the second insulating layer to expose the transistor regions; removing the sacrificial channel with an etching process to form a cavity; disposing a semiconductor channel in the cavity; disposing a gate dielectric over the semiconductor channel; filling the first trenches with a conductive material to form a plurality of word lines; forming second trenches through the second insulating layer to expose the capacitor regions; disposing a capacitor dielectric over the exposed capacitor electrodes; and filling the second trenches with a conductive material.

Example 14: the method of Example 13, wherein four or more memory cell regions are patterned into each conductive layer.

Example 15: the method of Example 13 or Example 14, wherein the plurality of conductive layers in the stack comprises eight or more layers.

Example 16: the method of Examples 13-15, wherein the stack is positioned in back end metal layers of a die.

Example 17: a memory cell, comprising: a transistor, wherein the transistor comprises: a semiconductor channel with a first end and a second end opposite the first end; a gate dielectric over a surface of the semiconductor channel between the first end and the second end; a bit line contacting the first end of the semiconductor channel; and a word line contacting the gate dielectric, wherein the bit line extends in a direction that is substantially orthogonal to the word line; and a capacitor, wherein the capacitor comprises: a capacitor electrode, wherein the capacitor electrode contacts the second end of the semiconductor channel; a capacitor dielectric over the capacitor electrode; and a ground electrode contacting the capacitor dielectric.

Example 18: the memory cell of Example 17, wherein the capacitor and the transistor are in the same plane.

Example 19: the memory cell of Example 17 or Example 18, wherein the capacitor electrode and the bit line have the same thickness.

Example 20: the memory cell of Examples 17-19, wherein the capacitor electrode and the drain electrode are interdigitated.

Example 21: the memory cell of Examples 17-20, wherein the semiconductor channel is a thin film semiconductor.

Example 22: the memory cell of Examples 17-21, wherein the memory cell is a part of a three-dimensional array of memory cells.

Example 23: the memory cell of Examples 17-22, wherein the memory cell is in a back end metal layer of a die.

Example 24: an electronic system, comprising: a motherboard; a die coupled to the motherboard, wherein the die comprises: a substrate surface; and a three-dimensional (3D) array of memory cells over the substrate surface, wherein each memory cell comprises a transistor and a capacitor, wherein the transistor and the capacitor are oriented in a plane that is substantially parallel to the substrate surface, and wherein the transistor of each memory cell comprises: a semiconductor channel, wherein a first end of the semiconductor channel is electrically coupled to a bit line that runs substantially parallel to the substrate surface, and a second end of the semiconductor channel is electrically coupled to the capacitor; and a gate dielectric on a surface of the semiconductor channel between the first end and the second end of the semiconductor channel, wherein the gate dielectric is contacted by a word line that runs substantially perpendicular to the substrate; and wherein the capacitor of each memory cell comprises: a capacitor electrode electrically coupled to the second end of the semiconductor channel; a capacitor dielectric over the capacitor electrode; and a drain electrode.

Example 25: the electronic system of Example 24, wherein the 3D array of memory cells is positioned in a back end metal layer of the die.

What is claimed is:
1. A method of forming a memory device, comprising:
forming a stack comprising a plurality of conductive layers alternating with first insulating layers;
patterning the stack, wherein each conductive layer is patterned to form a bit line and an array of memory cell regions, each memory cell region comprising:
a transistor region having a sacrificial channel formed of the conductive layer; and
a capacitor region having a capacitor electrode formed of the conductive layer and connected to the sacrificial channel;

forming spacers along sidewalls of the bit lines;
disposing a second insulating layer over the patterned stack and the spacers;
forming first trenches through the second insulating layer to expose the transistor regions;
removing the sacrificial channel with an etching process to form a cavity;
disposing a semiconductor channel in the cavity;
disposing a gate dielectric over the semiconductor channel;
filling the first trenches with a conductive material to form a plurality of word lines;
forming second trenches through the second insulating layer to expose the capacitor regions;
disposing a capacitor dielectric over the exposed capacitor electrodes; and
filling the second trenches with a conductive material.

2. The method of claim 1, wherein four or more memory cell regions are patterned into each conductive layer.

3. The method of claim 1, wherein the plurality of conductive layers in the stack comprises eight or more layers.

4. The method of claim 1, wherein the stack is positioned in back end metal layers of a die.

5. A method of fabricating a memory device, the method comprising:
forming a three-dimensional (3D) array of memory cells over a substrate surface, wherein each memory cell comprises a transistor and a capacitor, the transistor comprising a semiconductor channel laterally adjacent to the capacitor in a plane parallel with the substrate surface, wherein a bit line runs substantially parallel to the substrate surface and couples memory cells along a length of the bit line and across a width of the bit line, and wherein forming the transistor of each memory cell comprises:
forming the semiconductor channel, wherein a first end of the semiconductor channel is electrically coupled to the bit line, wherein the bit line is in the plane parallel with the surface substrate, and a second end of the semiconductor channel is electrically coupled to the capacitor; and
forming a gate dielectric on a surface of the semiconductor channel between the first end and the second end of the semiconductor channel, wherein the gate dielectric is contacted by a word line that runs substantially perpendicular to the substrate surface.

6. The method of claim 5, further comprising:
forming a plurality of bit lines in a stack, wherein the bit lines are separated by insulating layers.

7. The method of claim 6, wherein the plurality of bit lines comprises eight or more bit lines.

8. The method of claim 6, wherein each bit line is electrically coupled to two or more semiconductor channels.

9. The method of claim 6, further comprising:
forming a spacer along sidewall surfaces of the plurality of bit lines.

10. The method of claim 6, wherein the plurality of bit lines terminate in a stair step pattern.

11. The method of claim 5, wherein the semiconductor channels are thin-film semiconductor channels.

12. The method of claim 5, wherein forming each capacitor comprises:
forming a capacitor electrode electrically coupled to the second end of the semiconductor channel;
forming a capacitor dielectric over the capacitor electrode; and
forming a drain electrode.

13. The method of claim 12, wherein the capacitor electrode and the drain electrode have interdigitated surfaces.

14. The method of claim 12, wherein a plurality of capacitors share the same drain electrode.

15. The method of claim 14, wherein the drain electrode extends in a direction parallel to the word line.

16. The method of claim 12, wherein the capacitor electrodes have a thickness that is equal to a thickness of the bit line.

17. A method of fabricating an electronic system, the method comprising:
providing a motherboard;
coupling a die to the motherboard, wherein the die comprises:
a substrate surface; and
a three-dimensional (3D) array of memory cells over the substrate surface, wherein each memory cell comprises a transistor and a capacitor, wherein the transistor comprises a semiconductor channel laterally adjacent to the capacitor in a plane that is substantially parallel to the substrate surface, wherein a bit line runs substantially parallel to the substrate surface and couples memory cells along a length of the bit line and across a width of the bit line, and wherein the transistor of each memory cell comprises:
the semiconductor channel, wherein a first end of the semiconductor channel is electrically coupled to the bit line, wherein the bit line is in the plane parallel with the surface substrate, and a second end of the semiconductor channel is electrically coupled to the capacitor; and
a gate dielectric on a surface of the semiconductor channel between the first end and the second end of the semiconductor channel, wherein the gate dielectric is contacted by a word line that runs substantially perpendicular to the substrate; and
wherein the capacitor of each memory cell comprises:
a capacitor electrode electrically coupled to the second end of the semiconductor channel;
a capacitor dielectric over the capacitor electrode; and
a drain electrode.

18. The method of claim 17, wherein the 3D array of memory cells is positioned in a back end metal layer of the die.

* * * * *